United States Patent
Shimooka et al.

(10) Patent No.: US 7,855,141 B2
(45) Date of Patent: Dec. 21, 2010

(54) SEMICONDUCTOR DEVICE HAVING MULTIPLE WIRING LAYERS AND METHOD OF PRODUCING THE SAME

(75) Inventors: Yoshiaki Shimooka, Kawasaki (JP); Hideki Shibata, Yokohama (JP); Hideshi Miyajima, Yokohama (JP); Kazuhiro Tomioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/501,839

(22) Filed: Jul. 13, 2009

(65) Prior Publication Data

US 2009/0280642 A1 Nov. 12, 2009

Related U.S. Application Data

(62) Division of application No. 11/565,530, filed on Nov. 30, 2006, now Pat. No. 7,589,014, which is a division of application No. 10/166,757, filed on Jun. 12, 2002, now abandoned.

(30) Foreign Application Priority Data

Jun. 12, 2001 (JP) ............................. 2001-177005

(51) Int. Cl.
H01L 21/4763 (2006.01)
(52) U.S. Cl. ................. 438/624; 438/622; 438/633; 438/637; 438/638; 438/639; 438/640; 438/650; 257/E21.582; 257/E21.585; 257/E21.621; 257/E21.641
(58) Field of Classification Search ............... 438/622, 438/624, 633, 637, 638, 639, 640, 650; 257/E21.582, 257/E21.585, E21.621, E21.641
See application file for complete search history.

(56) References Cited

U.S. PATENT DOCUMENTS

| 6,184,121 B1 | 2/2001 | Buchwalter et al. | 438/622 |
| 6,413,852 B1 | 7/2002 | Grill et al. | 438/619 |
| 6,475,909 B2 | 11/2002 | Uozumi | 438/678 |
| 6,531,407 B1 * | 3/2003 | Huang et al. | 438/758 |
| 2002/0081863 A1 | 6/2002 | Shimada et al. | |
| 2003/0148631 A1 | 8/2003 | Kuo et al. | 438/782 |

FOREIGN PATENT DOCUMENTS

| CN | 1203450 | 12/1998 |
| JP | 8-204188 | 8/1996 |

(Continued)

OTHER PUBLICATIONS

H. Sayama, et al. "80 NM CMOSFET Technology Using Double Offset-Implanted Source/Drain Extension and Low Temperature SiN Process" IEDM, pp. 239-242.

*Primary Examiner*—Long K Tran
(74) *Attorney, Agent, or Firm*—Oblon, Spivak, McClelland, Maier & Neustadt, L.L.P.

(57) ABSTRACT

A method of producing a semiconductor device having a plurality of wiring layers forms a first interlayer-insulating film, forms a plurality of grooves for wiring in the first interlayer-insulating film, fills metallic films in the grooves to form wirings, etches the first interlayer-insulating film with the wirings as a mask and removes the interlayer-insulating film between the wirings to provide grooves to be filled, and fills a second interlayer-insulating film made of a material of low dielectric constant in the grooves to be filled.

6 Claims, 23 Drawing Sheets

FOREIGN PATENT DOCUMENTS

| | | |
|---|---|---|
| JP | 10-189716 | 7/1998 |
| JP | 2910713 | 7/1998 |
| JP | 10-335458 | 12/1998 |
| JP | 11-233624 | 8/1999 |
| JP | 2000-49228 | 2/2000 |
| KR | 1998-064510 | 10/1998 |

* cited by examiner

SEMICONDUCTOR DEVICE HAVING MULTIPLE WIRING LAYERS AND METHOD OF PRODUCING THE SAME

CROSS REFERENCE TO RELATED APPLICATIONS

This application is a divisional application of U.S. patent application Ser. No. 11/565,530, filed on Nov. 30, 2006, which is a divisional and claims the benefit of priority under 35 U.S.C. §120 from U.S. application Ser. No. 10/166,757, filed Jun. 12, 2002, and claims the benefit of priority under 35 U.S.C. §119 of Japanese Patent Application No. 2001-177005, filed on Jun. 12, 2001. The entire contents of these applications are incorporated herein by reference.

BACKGROUND OF THE INVENTION

The present invention relates to a semiconductor device with a wiring structure having interlayer-insulating films each made of an insulating film with a low relative dielectric constant, especially a porous film, and a method of producing this type of semiconductor device.

Two major factors in delay in operation speed for large-scale integrated circuits are delay in operation of transistors themselves and delay (RC delay) in signals propagating through wirings.

Miniaturization and high integration of wirings and devices affects recent advancement in semiconductor fabrication process highlight the effects of RC delay rather than delay in operation of transistors themselves. Protection against RC delay promotes development of wiring materials of a low resistivity and insulating films of a low relative dielectric constant (called low-dielectric-constant insulating films hereinafter).

One recent wiring material is copper (Cu) with resistivity lower than a known wiring material aluminum (Al). Copper requires a relatively high vapor pressure in etching, and hence hard to be processed by reactive ion etching with chloride gas at a low vapor pressure. It is thus processed by damascene in wiring formation.

Developed for low-dielectric-constant insulating films is application of organic material-applied insulating films of a low relative dielectric constant in the range from about 2.5 to 2.8 such as methyl siloxane to multi-layered wiring processes.

Also there are developed porous insulating films having many nanometer-size pores. Porous insulating films can have relative dielectric constant of 2.5 or smaller by lowering the film density with pore-number adjustments. Use of porous insulating films as interlayer-insulating films in semiconductors with a multi-layered wiring structure protects against RC delays.

Organic material-applied insulating films having a low relative dielectric constant are, however, could suffer degradation or increase in hygroscopic property due to $O_2$ gas-ashing in resist-peeling process, when used as interlayer-insulating films in multi-layered wiring process. Insulating films having a low relative dielectric constant could also suffer clucks in etching process.

Moreover, porous insulating films could have a high relative dielectric constant due to permeation of etching gas and chemical solution into pores generated in the porous insulating films, and suffer clucks or peeling-off due to discharging of the etching gas and chemical solution in post-thermal processes.

A wiring-layer structure having interlayer-insulating films may have several types in accordance with a width of each of several wiring layers and a distance between adjacent wiring layers. Such a wiring-layer structure has a tendency to have a small width for each interlayer-insulating film provided laterally as the width of each wiring layer becomes small. This tendency is used for wiring-layer structure miniaturization.

One of the problems for such wiring-layer structure miniaturization is RC delay due to increase in parasitic capacitance between wiring layers.

Several techniques have been proposed for decreasing parasitic capacitance between wiring layers to prevent decrease in signal propagation speed and generation of crosstalks between wiring layers with different relative dielectric constants for interlayer-insulating films having a relatively big inter-wiring distance and those having a relatively small inter-wiring distance.

Japanese Patent No. 2910713 discloses a wiring-layer structure having interlayer-insulating films of high mechanical strength and also high moisture resistance in a wide wiring-interval region and those of low relative dielectric constant in a narrow wiring-interval region.

Japanese Unexamined Patent Publication No. 2000-49228 discloses a dual-damascene wiring-layer structure having a first wide region 240 between metallized portions and a second narrow region between metallized portions, made of a dielectric material having a low dielectric constant.

Neither prior art, however, discloses insulating-film structures at different layer stages of a multi-layered wiring structure.

In detail, the latter prior art does not discuss any multilayered wiring structure. The former discloses a multi-layered wiring structure in FIGS. 1, 5 and 7, for example, however, only for production of a wide first interlayer-insulating film 4 and a narrow second interlayer-insulating film 5 at the same layer stage. In other words, no discussion is made in the former prior art on a relation between the wiring layers for a lower-stage wiring 3 and an upper-stage wiring 10 and also production of a lower-stage first interlayer-insulating film 4 and the corresponding upper-stage fourth interlayer-insulating film 11 and their relative dielectric constants.

SUMMARY OF THE INVENTION

A method of producing a semiconductor device having a plurality of wiring layers according to the third aspect of the present invention forms first interlayer-insulating film; forms a plurality of grooves for wiring in the first interlayer-insulating film; fills metallic films in the grooves to form wirings; etches the first interlayer-insulating film with the wirings as a mask and removes the interlayer-insulating film between the wirings to provide grooves to be filled; and fills a second interlayer-insulating film made of a material of low dielectric constant in the grooves to be filled.

Further, a method of producing a semiconductor device having a plurality of wiring layers according to the fourth aspect of the present invention forms a first interlayer-insulating film; forms a plurality of grooves for wiring in the first interlayer-insulating film; fills metallic films in the wiring grooves to form wirings; etches the first interlayer-insulating film with the wirings as a mask and removes the interlayer-insulating film between the wirings to provide grooves to be filled; fills a second interlayer-insulating film made of at least one insulating film in the grooves to be filled, the insulating film being made of a material selected from the group consisting of resin having siloxane bonding as a major structure, resin having C—C bonding as a major structure and a resin having C═C bonding as a major structure, and changes the second interlayer-insulating film into a porous insulating film.

Moreover, a method of producing a semiconductor device having a plurality of wiring layers according to the fifth aspect of the present invention forms a first interlayer-insulating film; performs dehydrating polymerization to the first interlayer-insulating film; forms a plurality of grooves for wiring in the dehydrating-polymerized first interlayer-insulating film; fills metallic films in the wiring grooves to form wirings; and applies a solvent to the dehydrating-polymerized first interlayer-insulating film after the wiring formation.

DETAILED DESCRIPTION OF THE EMBODIMENTS

Several embodiments of semiconductor device having a plurality of wiring layers and method of producing the semiconductor device according to the present invention will be disclosed with reference to the attached drawings.

First Embodiment

Figure 1A:
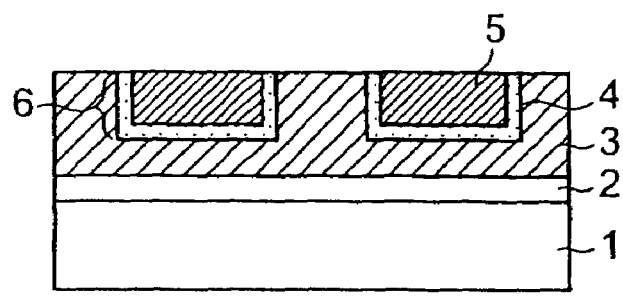
FIGS. 1(a), 1(b) and 1(c) are sectional views each illustrating an anterior process of a method of producing a semiconductor device having a plurality of wiring layers in a first embodiment according to the present invention.
Figure 1B:
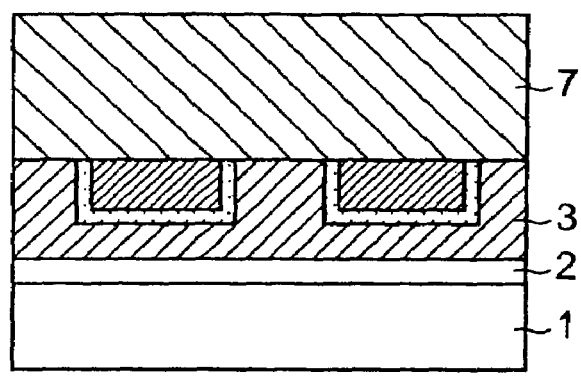
Figure 1C:
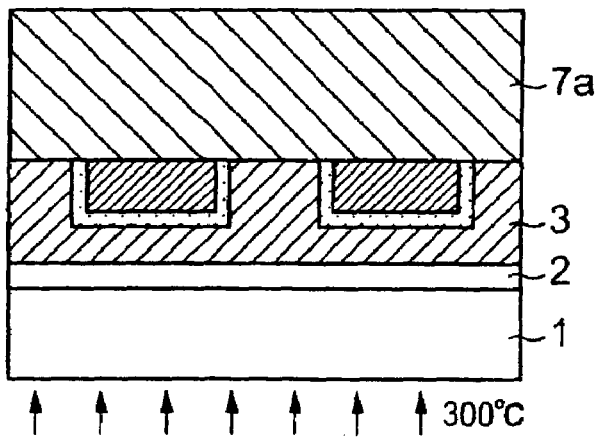

Disclosed first with reference to FIGS. 1(a), 1(b) and 1(c) is a method of producing a semiconductor device in a first embodiment according to the present invention.

As shown in FIG. 1(a), an insulating film 2 is formed on a semiconductor substrate 1, which will function as an insulative isolation layer. A first interlayer-insulating film 3, such as a TEOS film, is formed on the insulating film 2. Wiring grooves (grooves for wiring) are provided in the first interlayer-insulating film 3 for forming a first wiring layer 6 (including a first Cu wiring 5 and a barrier metal film 4) in each groove.

The barrier metal film 4 is then formed in each groove with deposition of a TaN film on the groove by sputtering or chemical vapor deposition (abbreviated to CVD hereinafter) for prevention of Cu dispersion and oxidation.

The Cu and TaN layers deposited on the device surface except the grooves are removed by chemical mechanical polishing (abbreviated to CMP hereinafter) until the first interlayer-insulating film 3 is exposed at the device surface, to polish the Cu layer 5 for forming the first wiring layer 6.

Next, as shown in FIG. 1(b), a second interlayer-insulating film 7 is formed on the first interlayer-insulating film 3. The second interlayer-insulating film 7 is made of a precursor of a porous insulating film, an insulating film having siloxane bonding as a major structure, to form a porous insulating film of porous methyl siloxane, porous silica, porous hydrogen silisesquioxane (abbreviated to HSQ hereinafter), porous poly arylene ether (abbreviated to PAE hereinafter) and porous poly arylene (abbreviated to PA hereinafter), etc. In addition to these materials, the second interlayer-insulating film 7 may be made of a resin having C—C or C═C bonding, a major structure, as a precursor of a porous insulating film.

Next, as shown in FIG. 1(c), the second interlayer-insulating film 7 is annealed at 300° C. for dehydrating polymerization. Usually, evaporation of solvent starts at about 200° C. with dehydrating polymerization at a temperature in the range from 300 to 450° C.

The first embodiment, however, requires dehydrating polymerization at a temperature as low as possible, for example, at about 300° C. before solvent evaporation. A starting temperature for dehydrating polymerization is lowered in the first embodiment by annealing the second interlayer-insulating film 7 in an $NH_3$-gas ambient or annealing the film 7 during, for example, electron-beam (EB) irradiation.

The reason for annealing at a low temperature is to allow cross linking whereas prevent generation of pores, thus cross linking only occurring to a part of the second interlayer-insulating film 7. Pores will be generated at 400° C. or higher as discussed later. A pore-generating process has to be performed after there is no possibility of harmful effects to pores during the process.

A second interlayer-insulating film 7a after dehydrating polymerization only has not been changed yet into a porous film while cross linking has only occurred to a part of the second interlayer-insulating film 7. And, hence permeation of etching gas and chemical solution into pores is out of consideration at this stage. A precursor of a porous insulating film exhibits a low mechanical strength. The dehydrating polymerization, however, generates siloxane bonding among molecules in an insulating film to enhance mechanical strength for the film. The second interlayer-insulating film 7a with a high mechanical strength thus enhanced can be processed with least damages by reactive ion etching (abbreviated to RIE hereinafter).

Figure 1D:
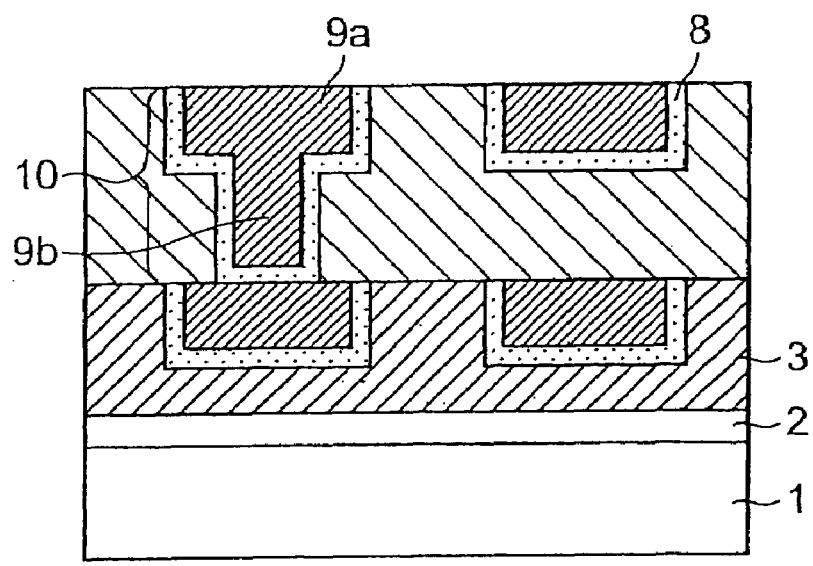
FIGS. 1(d) and 1(e) are sectional views illustrating posterior processes following the process shown in FIG. 1(c) for the method of producing the semiconductor device having the wiring layers in the first embodiment according to the present invention.

The second interlayer-insulating film 7a subjected to dehydrating polymerization is processed with lithography and RIE to provide first contact holes and second wiring grooves simultaneously, as shown in FIG. 1(d).

A TaN layer and then a Cu layer are deposited on the second interlayer-insulating film 7a, the first contact holes and the second wiring grooves. Unnecessary Cu and TaN layers are removed by CMP until the second interlayer-insulating film 7a is exposed at the device surface, thus forming a second wiring layer 10 having a second wiring 9a and a first plug 9b.

Figure 1E:
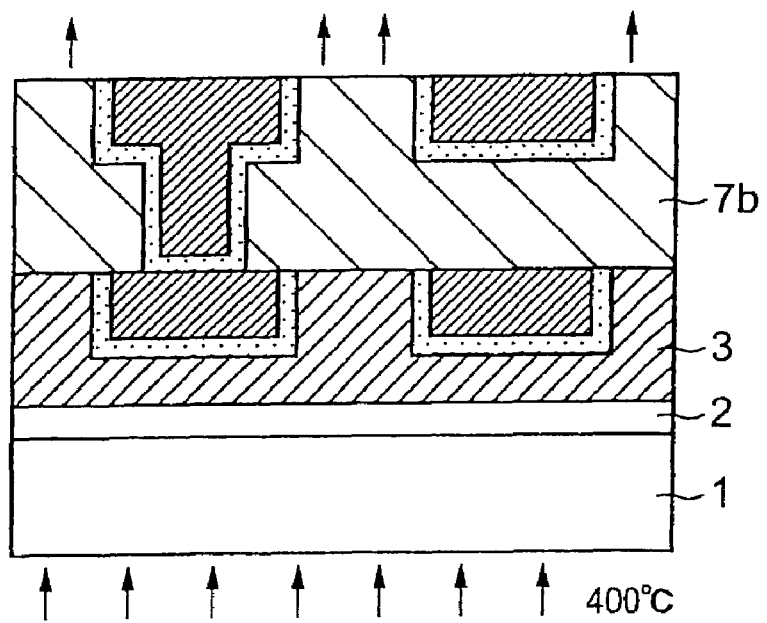

The second interlayer-insulating film 7a subjected to dehydrating polymerization is further subjected to solvent evaporation at about 400° C. to generate pores therein for the first time through the processes, thus being changed into a porous insulating film 7b, as shown in FIG. 1(e).

As disclosed, the first embodiment performs processing such as RIE to the second interlayer-insulating film 7a before generation of pores, thus having no problem of permeation of etching gas and chemical solution into the pores.

Second Embodiment

Figure 2A:
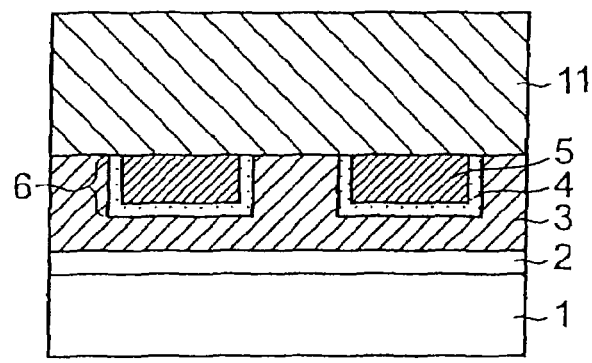
FIGS. 2(a), 2(b) and 2(c) are sectional views each illustrating an anterior process of a method of producing a semiconductor device having a plurality of wiring layers in a second embodiment according to the present invention.
Figure 2B:
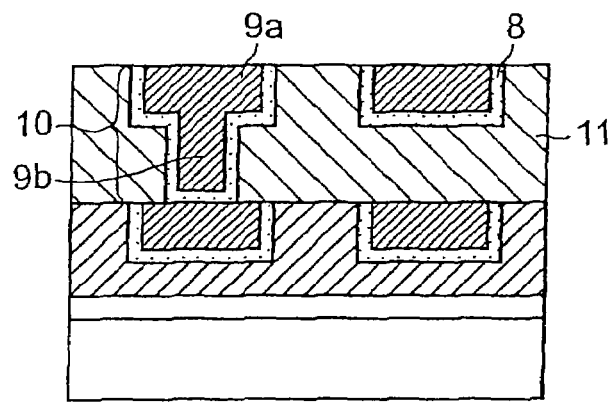
Figure 2C:
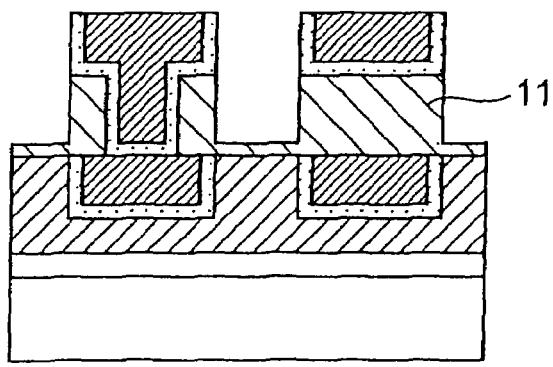
Figure 2D:
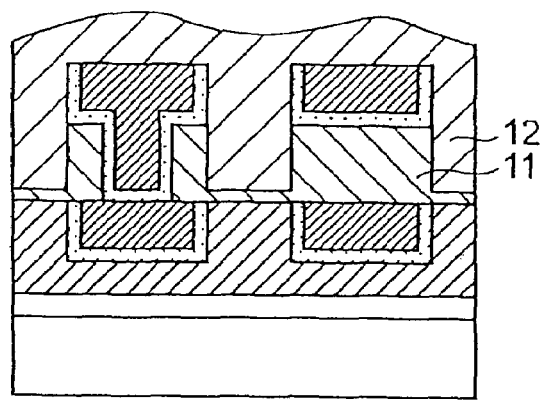
FIGS. 2(d), 2(e) and 2(f) are sectional views illustrating posterior processes following the process shown in FIG. 2(c) for the method of producing the semiconductor device having the wiring layers in the second embodiment according to the present invention.
Figure 2E:
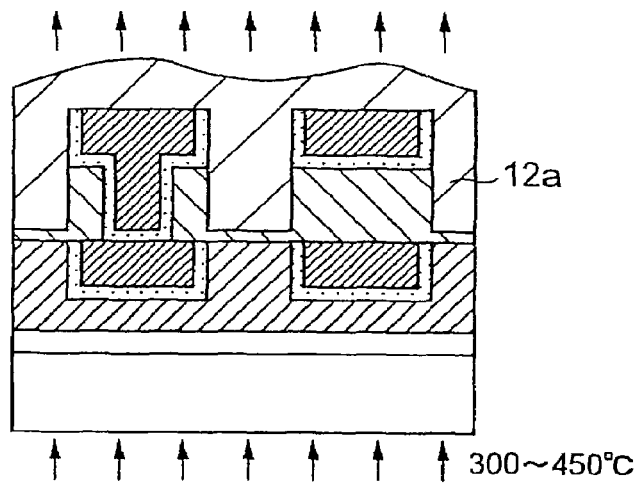
Figure 2F:
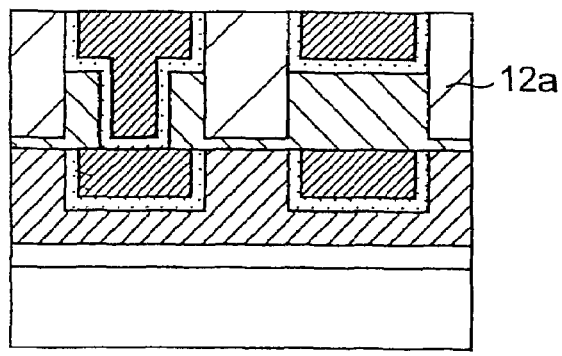

Disclosed next with reference to FIGS. 2(a), 2(b) and 2(c) and also FIGS. 2(d), 2(e) and 2(f) is a method of producing a semiconductor device in a second embodiment according to the present invention.

The processes for forming the first wiring layer 6 are the same as shown in FIG. 1(a) for the first embodiment, and hence not disclosed and shown for brevity.

As shown in FIG. 2(a), a second interlayer-insulating film 11 is deposited on the first interlayer-insulating film 3. In detail, the second interlayer-insulating film 11 is formed by CVD to deposit a specific insulating film on the first interlayer-insulating film 3. The specific insulating film is a tetra ethyl ortho silicate (abbreviated to TEOS hereinafter) film, a non-doped silicate glass (abbreviated to NSG hereinafter) film and fluorine-doped silicate glass (abbreviated to FSG hereinafter) film, etc.

Or, the second interlayer-insulating film 11 can be formed by applying another specific insulating film on the first interlayer-insulating film 3. The other specific insulating film is an HSQ film, a polymethyl siloxane film and methyl silsesquioxane (abbreviated to MSQ hereinafter), etc.

Next, as shown in FIG. 2(b), the second interlayer-insulating film 11 is processed with lithography and RIE to provide first contact holes and second wiring grooves simultaneously.

A TaN layer and then a Cu layer are deposited on the second interlayer-insulating film 11, the first contact holes and the second wiring grooves. Unnecessary Cu and TaN layers are removed by CMP until the second interlayer-insulating film 11 is exposed at the device surface, thus forming the second wiring layer 10 having the second wiring 9a and the first plug 9b. The second interlayer-insulating film 11 is a TEOS film.

Next, as shown in FIG. 2(c), the second interlayer-insulating film 11 is removed by RIE with the second wiring 9a as a mask. Removal of the second interlayer-insulating film 11 will, however, halt before the first interlayer-insulating film 3 is exposed at the device surface, for protection of the film 3. The second interlayer-insulating film 11 may be removed after an insulating film, such as an SiN film, is formed on the second wiring 9a for protecting the wiring 9a against damages which may otherwise occur when it is used as the RIE mask.

Next, as shown in FIG. 2(d), a third interlayer-insulating film 12 is deposited on the second interlayer-insulating film 11 and the second wiring 9a. The third interlayer-insulating film 12 is made of a precursor of a porous insulating film, an insulating film having siloxane bonding as a major structure, to form a porous insulating film of porous methyl siloxane, porous silica, porous HSQ, porous PAE and porous PA, etc. In addition to these materials, the third interlayer-insulating film 12 may be made of a resin having C—C or C═C bonding, a major structure, as a precursor of a porous insulating film.

Next, as shown in FIG. 2(e), a thermal process is performed at a temperature in the range from 300 to 450° C. for promoting dehydrating polymerization and also for solvent evaporation, to change the third interlayer-insulating film 12 into a porous insulating film 12a having many pores.

The porous insulating film 12a changed from the third interlayer-insulating film 12 is polished and removed to flatten the device surface by CMP until the second interlayer-insulating film 10 is exposed at the device surface, as shown in FIG. 2(f).

The process of flattening the third interlayer-insulating film may be performed to the third interlayer-insulating film 12 before the thermal process or to the porous insulating film 12a after the thermal process. In detail, the third interlayer-insulating film 12 may be flattened just after deposited in FIG. 2(d), as being made of the precursor of the porous insulating film. And, then the porous insulating film 12a may be formed by dehydrating polymerization and solvent evaporation to the flattened third interlayer-insulating film 12.

This modification to the second embodiment forms the porous insulating film after the second wiring 10 has been formed, thus requiring no processes such as lithography and RIE to the porous insulating film, hence causing no damages and harmful effects to the porous insulating film.

Low-dielectric-constant insulating films such as porous insulating films could suffer cracks, etc., due to their low mechanical strength, against stresses applied in a vertical direction (a direction almost orthogonal to the horizontal plane of the insulating films during packaging process such as bonding.

As disclosed, the second embodiment forms the second insulating film 11 of mechanical strength relatively higher than those of low dielectric constant under the second wiring 9a, to enhance relative mechanical strength for the interlayer-insulating film for avoiding adverse effects such as cracks.

Third Embodiment

Figure 3A:
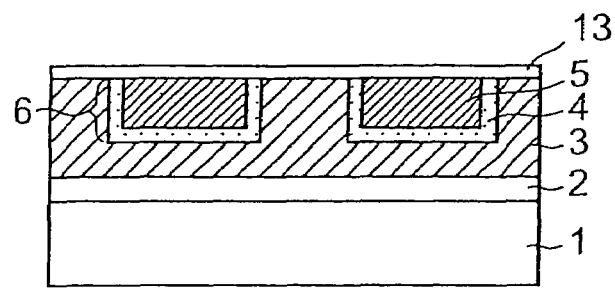
FIGS. 3(a), 3(b) and 3(c) are sectional views each illustrating an anterior process of a method of producing a semiconductor device having a plurality of wiring layers in a third embodiment according to the present invention.
Figure 3B:
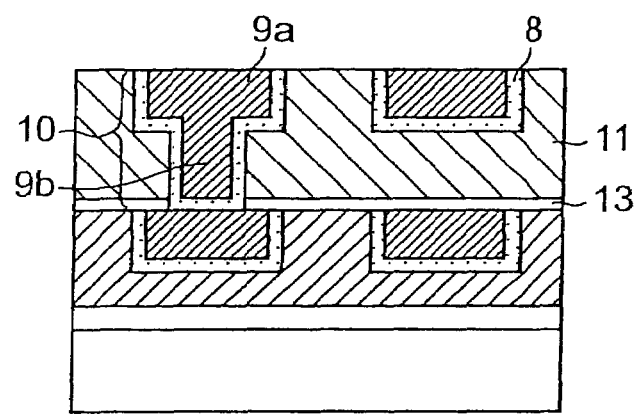
Figure 3C:
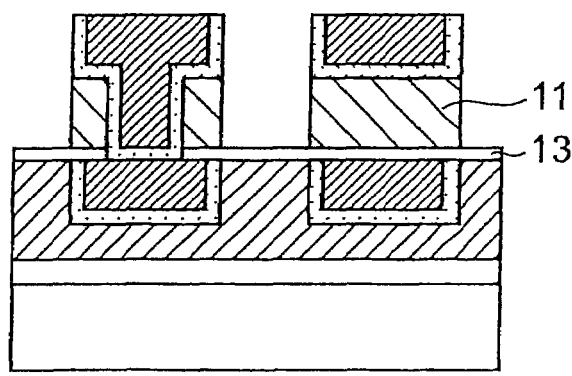
Figure 3D:
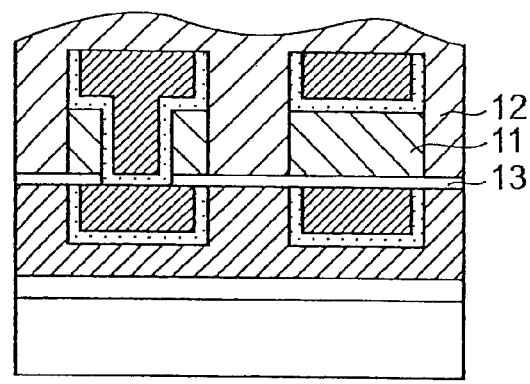
FIGS. 3(d), 3(e) and 3(f) are sectional views illustrating posterior processes following the process shown in FIG. 3(c) for the method of producing the semiconductor device having the wiring layers in the third embodiment according to the present invention.
Figure 3E:
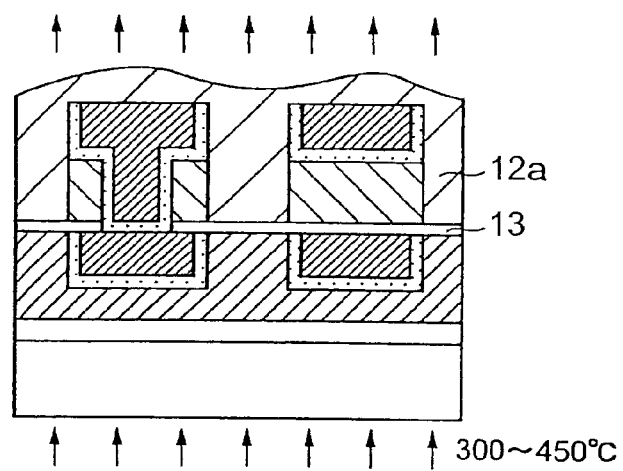
Figure 3F:
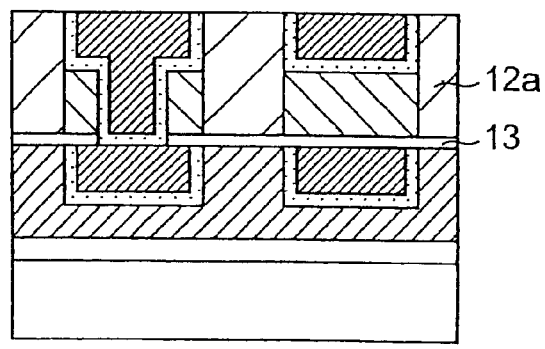

Disclosed next with reference to FIGS. 3(a), 3(b) and 3(c) and also FIGS. 3(d), 3(e) and 3(f) is a method of producing a semiconductor device in a third embodiment according to the present invention.

As shown in FIG. 3(a), the insulating film 2 is formed on the semiconductor substrate 1, which will function as an insulative isolation layer. The first interlayer-insulating film 3 is formed on the insulating film 2. Wiring grooves are provided in the first interlayer-insulating film 3 for forming the first wiring layer 6 (including the first Cu wiring 5 and the barrier metal film 4) in each groove.

A TaN film and then a Cu layer are deposited on the grooves for prevention of Cu dispersion and oxidation. Unnecessary Cu layer and TaN film are polished and removed by CMP until the first interlayer-insulating film 3 is exposed at the device surface.

A barrier insulating film 13 as a barrier film is formed on the first interlayer-insulating film 3. The barrier insulating film 13 protects the first Cu wiring against Cu dispersion and oxidation, and also the first interlayer-insulating film against any effects which may otherwise be caused due to formation of upper interlayer-insulating films in later processes.

Next, as shown in FIG. 3(b), the second interlayer-insulating film 11 is deposited on the barrier insulating film 13. Like the second embodiment, the second interlayer-insulating film 11 is formed by CVD to deposit a TEOS film, etc., or applying HSQ on the barrier insulating film 13.

The second interlayer-insulating film 11 and the barrier insulating film 13 are processed with lithography and RIE to provide the first contact holes and the second wiring grooves simultaneously.

A TaN layer and then a Cu layer are deposited on the second interlayer-insulating film 11, the first contact holes and the second wiring grooves. Unnecessary Cu and TaN layers are removed by CMP until the second interlayer-insulating film 11 is exposed at the device surface, thus forming the second wiring layer 10 having the second wiring 9a and the first plug 9b.

Next, as shown in FIG. 3(c), the second interlayer-insulating film 11 is removed by RIE with the second wiring 9a as a mask until the barrier insulating film 13 is exposed at the device surface. The second interlayer-insulating film 11 may be removed after an insulating film, such as an SiN film, is formed on the second wiring 9a for protecting the wiring 9a, like the second embodiment.

Next, as shown in FIG. 3(d), the third interlayer-insulating film 12 is deposited on the barrier insulating film 13 and the second wiring 9a. The third interlayer-insulating film 12 is made of a precursor of a porous insulating film, such as porous methyl siloxane, like the second embodiment.

Next, as shown in FIG. 3(e), a thermal process is performed at a temperature in the range from 300 to 450° C. for promoting dehydrating polymerization and also for solvent evaporation, to change the third interlayer-insulating film 12 into the porous insulating film 12a having many pores, like the second embodiment.

The porous insulating film 12a changed from the third interlayer-insulating film 12 is polished and removed to flatten the device surface by CMP until the second interlayer-insulating film 10 is exposed at the device surface, as shown in FIG. 3(f).

The process of flattening the porous insulating film 12a as the third interlayer-insulating film may be performed to the third film before changed into the porous insulating film 12a. In detail, the third interlayer-insulating film 12 may be flattened just after deposited in FIG. 3(d), as being made of the precursor of the porous insulating film. And, then the porous insulating film 12a may be formed by dehydrating polymerization and solvent evaporation to the flattened third interlayer-insulating film 12.

Like the second embodiment, the third embodiment forms the porous insulating film after the second wiring 10 has been formed, thus requiring no processes such as lithography and RIE to the porous insulating film, hence causing no damages and harmful effects to the porous insulating film.

Fourth Embodiment

Figure 4A:
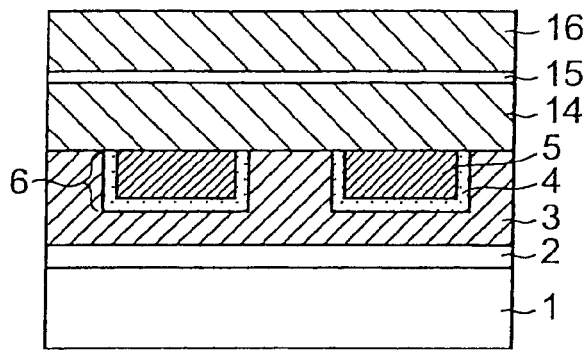
FIGS. 4(a), 4(b) and 4(c) are sectional views each illustrating an anterior process of a method of producing a semiconductor device having a plurality of wiring layers in a fourth embodiment according to the present invention.
Figure 4B:
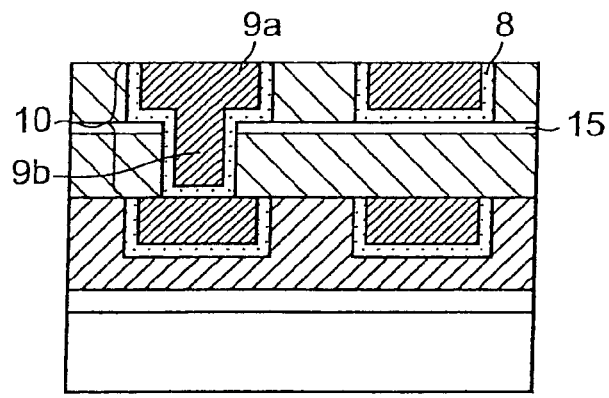
Figure 4C:
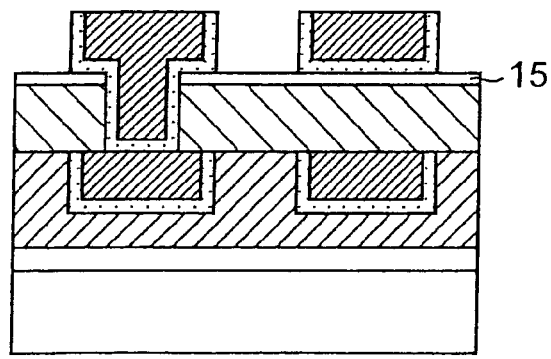
Figure 4D:
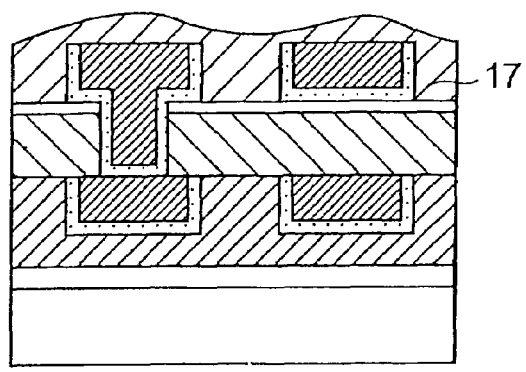
FIGS. 4(d), 4(e) and 4(f) are sectional views illustrating posterior processes following the process shown in FIG. 4(c) for the method of producing the semiconductor device having the wiring layers in the fourth embodiment according to the present invention.
Figure 4E:
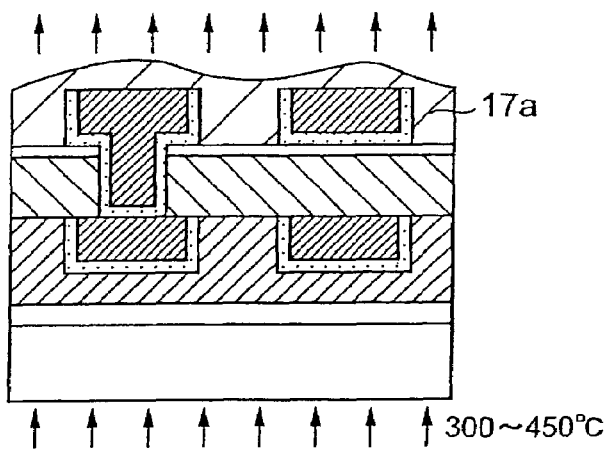
Figure 4F:
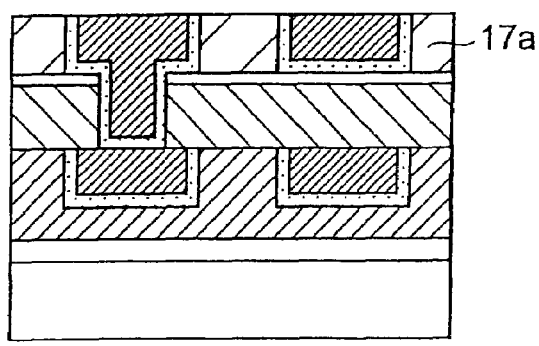

Disclosed next with reference to FIGS. 4(a), 4(b) and 4(c) and also FIGS. 4(d), 4(e) and 4(f) is a method of producing a semiconductor device in a fourth embodiment according to the present invention.

The processes for forming the first wiring layer 6 are the same as shown in FIG. 1(a) in the first embodiment, and hence not disclosed and shown for brevity.

As shown in FIG. 4(a), a second interlayer-insulating film 14 is deposited on the first interlayer-insulating film 3. The second interlayer-insulating film 14 is formed by CVD with a TEOS film, etc., or applying HSQ, like the second and third embodiments.

Next, as shown in FIG. 4(b), the second interlayer-insulating film 14, a barrier film 15 and a third interlayer-insulating film 16 are processed with lithography and RIE to provide first contact holes and second wiring grooves.

A TaN layer and then a Cu layer are deposited on the first contact holes and the second wiring grooves. Unnecessary Cu and TaN layers are removed by CMP, thus forming the second wiring layer 10 having the second wiring 9a and the first plug 9b.

Next, as shown in FIG. 4(c), the third interlayer-insulating film 16 is removed by RIE until the barrier film 15 is exposed at the device surface. Like the first and second embodiments, the second interlayer-insulating film 14 can be protected by removing the third interlayer-insulating film by CMP after an insulating film, such as an SiN film, is formed on the second interlayer-insulating film 14.

Next, as shown in FIG. 4(d), a fourth interlayer-insulating film 17 is deposited on the barrier film 15 and the second interlayer-insulating film 14. The fourth interlayer-insulating film 17 is made of a precursor of a porous insulating film, such as porous methyl siloxane.

Next, as shown in FIG. 4(e), a thermal process is performed at a temperature in the range from 300 to 450° C. for promoting dehydrating polymerization and also for solvent evaporation, to change the fourth interlayer-insulating film 17 into a porous insulating film 17a having many pores.

The porous insulating film 17a as the fourth interlayer-insulating film 17 is polished and removed to flatten the device surface by CMP until the second wiring 9a is exposed at the device surface, as shown in FIG. 4(f).

The process of flattening the porous insulating film 17a as the fourth interlayer-insulating film may be performed before the thermal process to form the porous insulating film 17a. In detail, the fourth interlayer-insulating film 17 may be flattened just after deposited in FIG. 4(d), as being made of the precursor of the porous insulating film. And, then the porous insulating film 17a may be formed by dehydrating polymerization and solvent evaporation to the flattened fourth interlayer-insulating film 17.

Like the first and second embodiments, the fourth embodiment forms the porous insulating film after the second wiring 10 has been formed, thus requiring no processes such as lithography and RIE to the porous insulating film, hence causing no damages to the porous insulating film.

Moreover, the fourth embodiment provides the insulating film, of higher mechanical strength than the porous insulating film, between the first wiring 6 and the second wiring 9a, hence achieving an excellent device property against vertically applied stresses.

In the foregoing, a porous insulating film is used for the second interlayer-insulating film in the first embodiment, the third interlayer-insulating film in the second and third embodiments and also the fourth interlayer-insulating film in the fourth embodiment.

Not only that, however, the present invention can use an organic material-applied insulating film such as methyl siloxane for those interlayer-insulating films, instead of a porous insulating film.

Fifth Embodiment

Figure 5A:
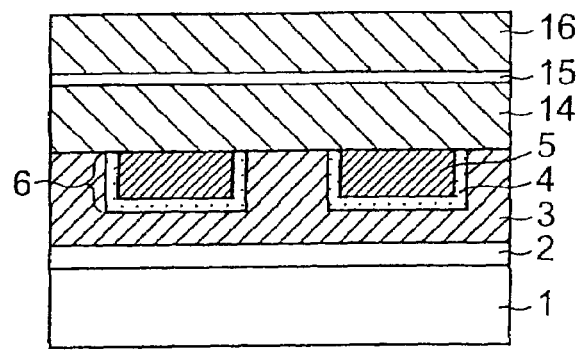
FIGS. 5(a), 5(b) and 5(c) are sectional views each illustrating an anterior process of a method of producing a semiconductor device having a plurality of wiring layers in a fifth embodiment according to the present invention.
Figure 5B:
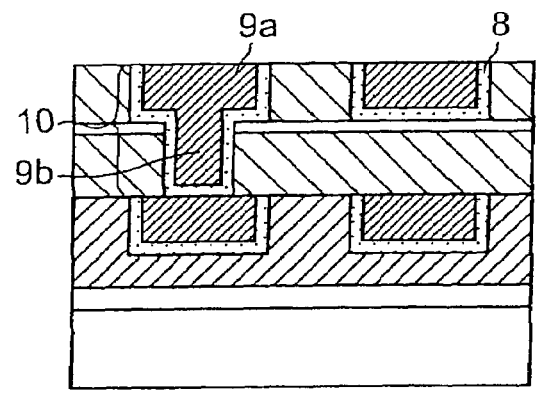
Figure 5C:
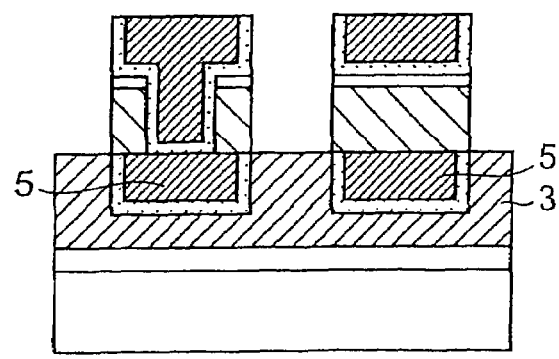
Figure 5D:
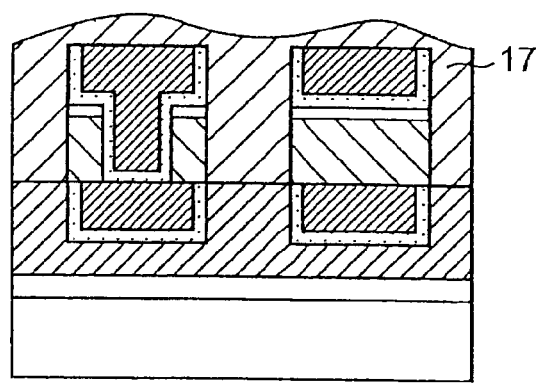
FIGS. 5(d), 5(e) and 5(f) are sectional views illustrating posterior processes following the process shown in FIG. 5(c) for the method of producing the semiconductor device having the wiring layers in the fifth embodiment according to the present invention.
Figure 5E:
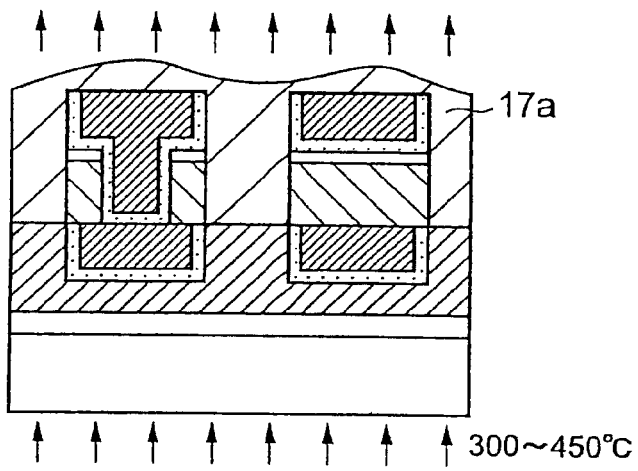
Figure 5F:
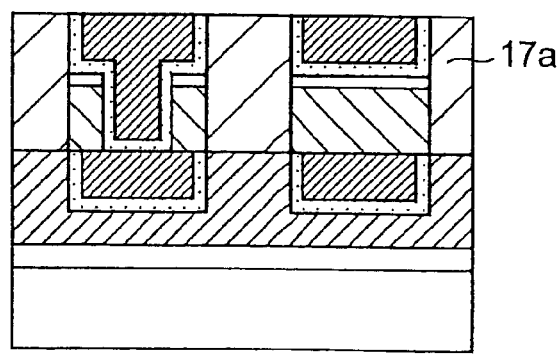

Disclosed next with reference to FIGS. 5(a), 5(b) and 5(c) and also FIGS. 5(d), 5(e) and 5(f) is a method of producing a semiconductor device having a plurality of wiring layers in a fifth embodiment according to the present invention.

The production method in the fifth embodiment corresponds to the fourth embodiment providing the barrier film 15 with additional processes of removing the second interlayer-insulating film 11 with the second wiring 9a as a mask by RIE until the barrier insulating film 13 is exposed at the device surface, like the third embodiment.

Like the second and third embodiments, the fifth embodiment protects the second wiring 9a by removing the second interlayer-insulating film 11 after an insulating film of SiN, etc., is formed on the wiring 9a. Therefore, the processes in FIGS. 5(a) and 5(b) correspond to those in FIGS. 4(a) and 4(b), respectively.

The fifth embodiment employs an etchant different from the one used in the fourth embodiment for etching the device surface to reach the upper surfaces of the first interlayer-insulating film 3 and the first wiring 5, the remaining un-etched portion corresponding to the widths of the wiring 9 and the metal 8.

The posterior processes shown in FIGS. 5(d), 5(e) and 5(f) correspond to those in FIGS. 3(d), 3(e) and 3(f) for the third embodiment, and hence the disclosure being omitted for brevity.

Sixth to Ninth Embodiments

The methods of producing a semiconductor device having a plurality of wiring layers in the second to fifth embodiments offer no protection against etching on the second wiring 9 and the barrier metal 8.

Not only these embodiments, the present invention employs a cap layer 18 to protect the second wiring 9 and the barrier metal 8 against etching according to sixth to ninth embodiments shown in FIGS. 6(a), 6(b) and 6(c) to 6(f). The sixth to ninth embodiments correspond to the second to fifth embodiments, respectively. In the sixth to ninth embodiments, the cap layer 18 remains on the second wiring 9 including the barrier metal 8 for the posterior processes.

Figure 6:
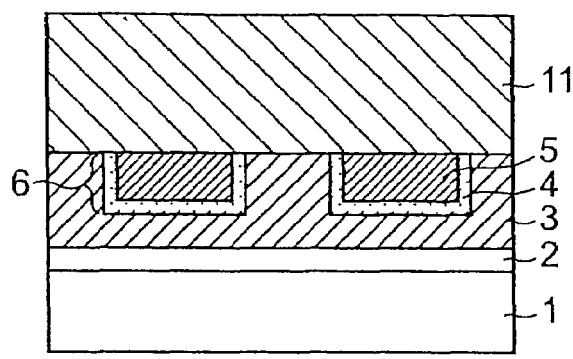
FIGS. 6(a), 6(b) and 6(c) are sectional views each illustrating an anterior process of a method of producing a semiconductor device having a plurality of wiring layers in a sixth embodiment according to the present invention.
FIGS. 6(d), 6(e) and 6(f) are sectional views illustrating posterior processes following the process shown in FIG. 6(c) for the method of producing the semiconductor device having the wiring layers in the sixth embodiment according to the present invention.
Figure 6:
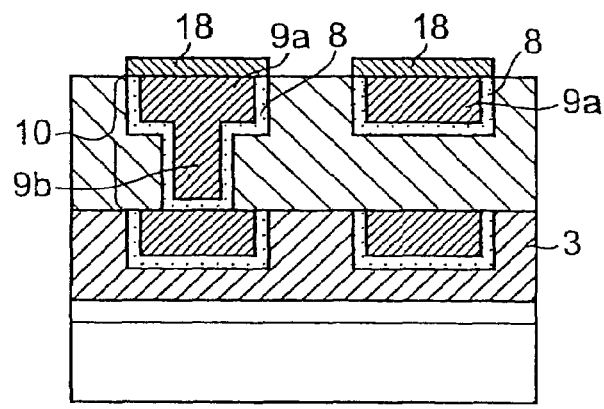
Figure 6:
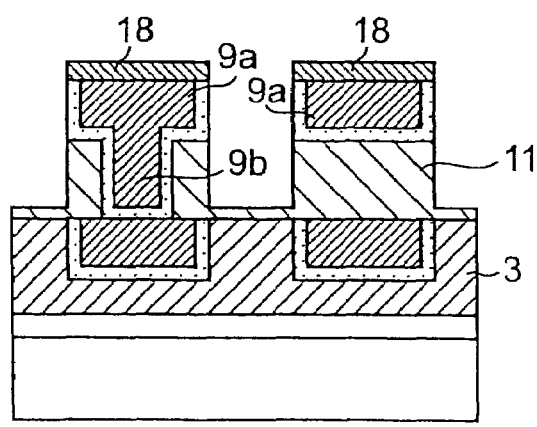
Figure 6:
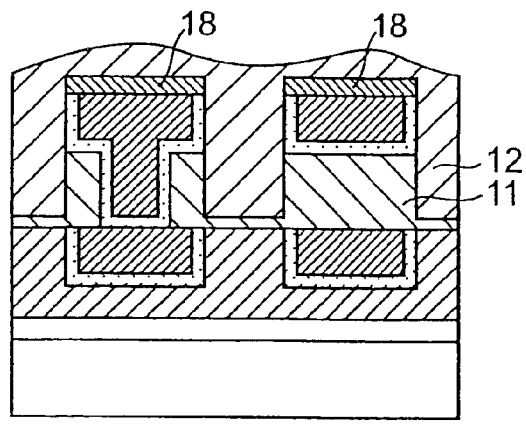
Figure 6:
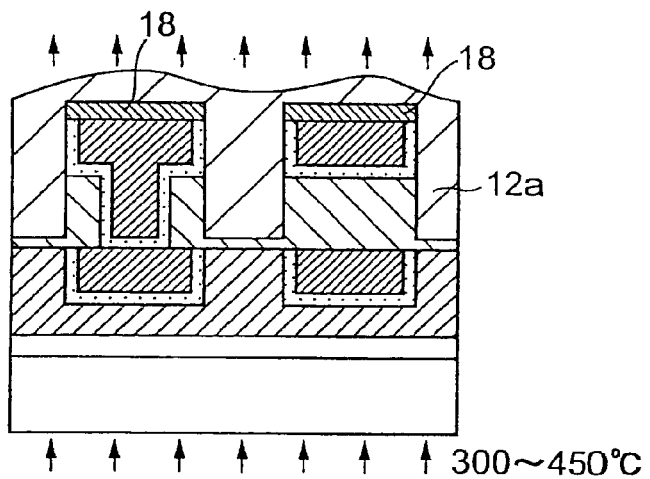
Figure 6:
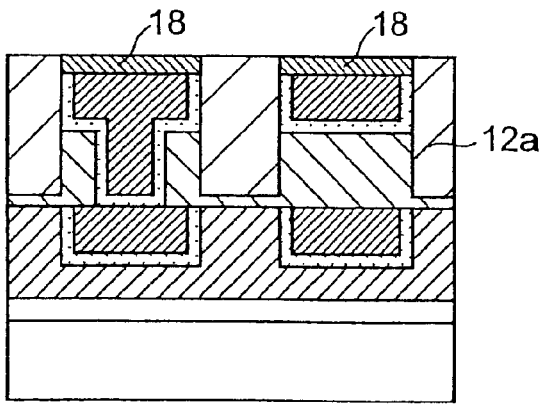

The sixth embodiment shown in FIGS. 6(a), 6(b) and 6(c), and 6(d), 6(e) and 6(f) correspond to the second embodiment shown in FIGS. 2(a), 2(b) and 2(c), and 2(d), 2(e) and 2(f). The sixth embodiment forms the cap layer 18 as an etching mask by lithography and etching as shown in FIG. 6(b) after the processes corresponding to those shown in FIGS. 2(a) and 2(b).

The cap layer 18 may be a CVD-SiN film or an SiC film, which is a hard mask functioning to protect the wiring 9 against etching damages. The cap layer 18 remains on the wiring 9 for the posterior processes, which will be buried during integration, thus requiring no peeling-off process, for example.

Figure 7:
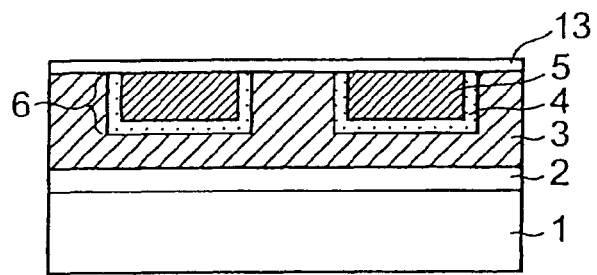
FIGS. 7(a), 7(b) and 7(c) are sectional views each illustrating an anterior process of a method of producing a semiconductor device having a plurality of wiring layers in a seventh embodiment according to the present invention.
FIGS. 7(d), 7(e) and 7(f) are sectional views illustrating posterior processes following the process shown in FIG. 7(c) for the method of producing the semiconductor device having the wiring layers in the seventh embodiment according to the present invention.
Figure 7:
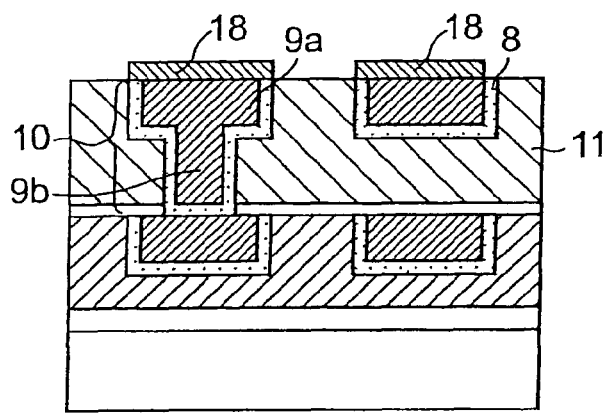
Figure 7:
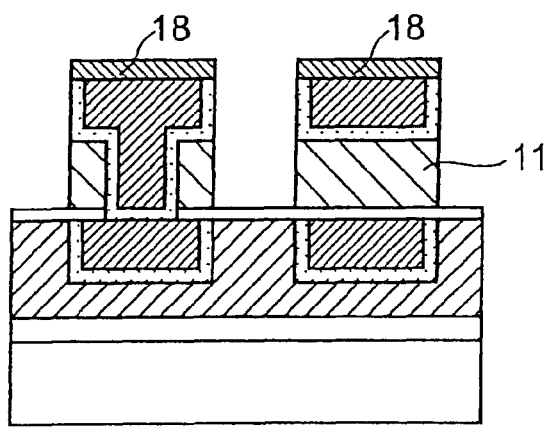
Figure 7:
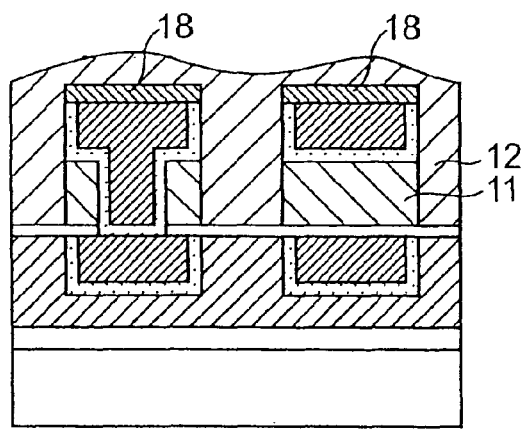
Figure 7:
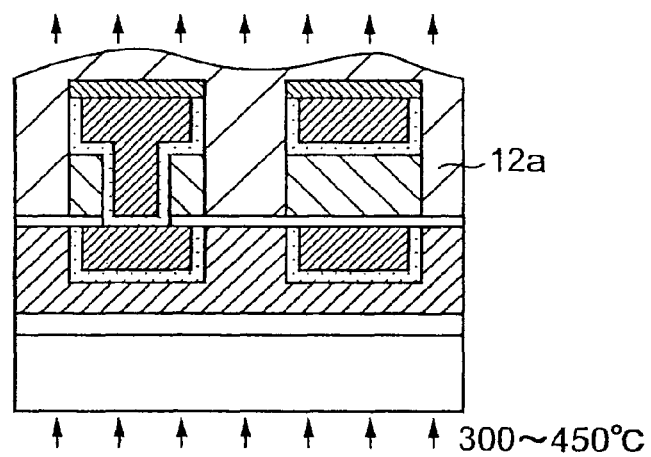
Figure 7:
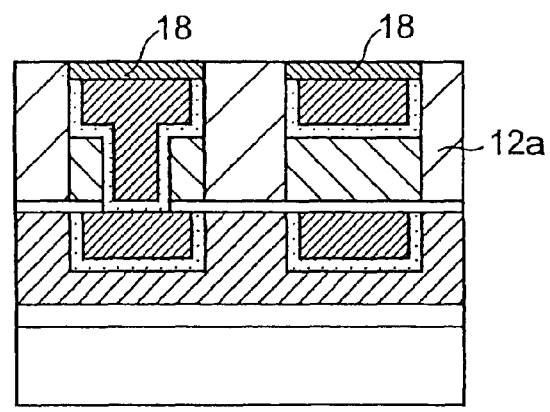

The seventh embodiment shown in FIGS. 7(a), 7(b) and 7(c), and 7(d), 7(e) and 7(f) correspond to the third embodiment shown in FIGS. 3(a), 3(b) and 3(c), and 3(d), 3(e) and 3(f). The seventh embodiment forms the cap layer 18 as an etching mask by lithography and etching as shown in FIG. 7(b) after the processes corresponding to those shown in FIGS. 3(a) and 3(b). The function of the cap layer 18 and the following processes are evident from the disclosure in the sixth embodiment.

Figure 8:
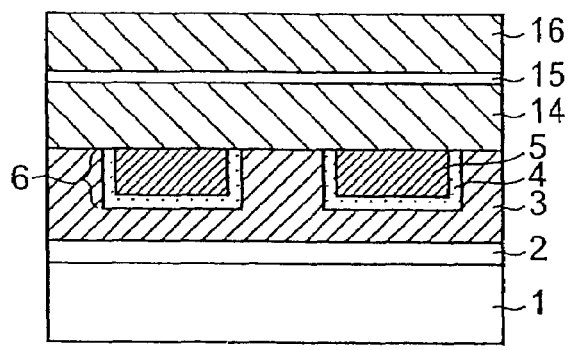
FIGS. 8(a), 8(b) and 8(c) are sectional views each illustrating an anterior process of a method of producing a semiconductor device having a plurality of wiring layers in an eighth embodiment according to the present invention.
FIGS. 8(d), 8(e) and 8(f) are sectional views illustrating posterior processes following the process shown in FIG. 8(c) for the method of producing the semiconductor device having the wiring layers in the eighth embodiment according to the present invention.
Figure 8:
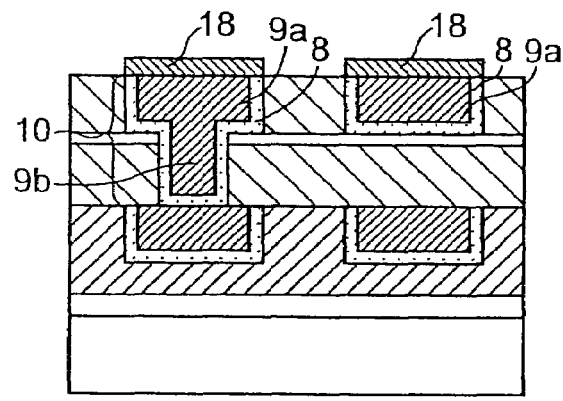
Figure 8:
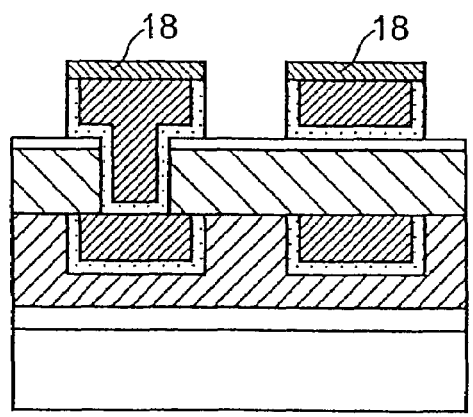
Figure 8:
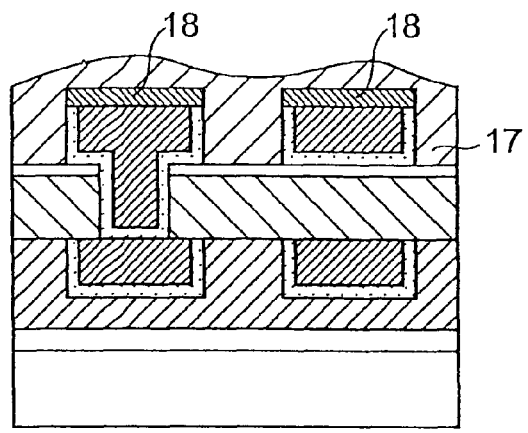
Figure 8:
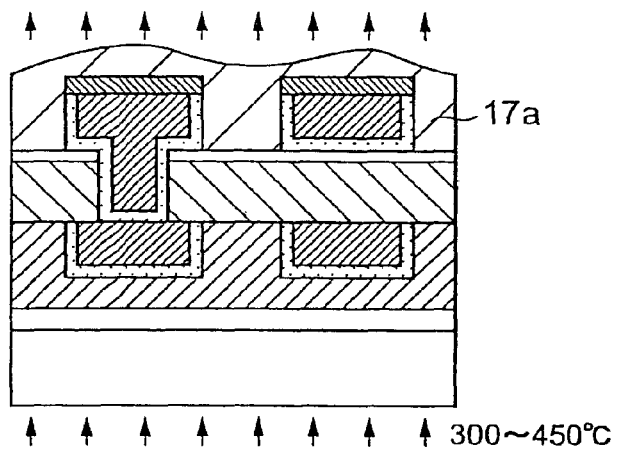
Figure 8:
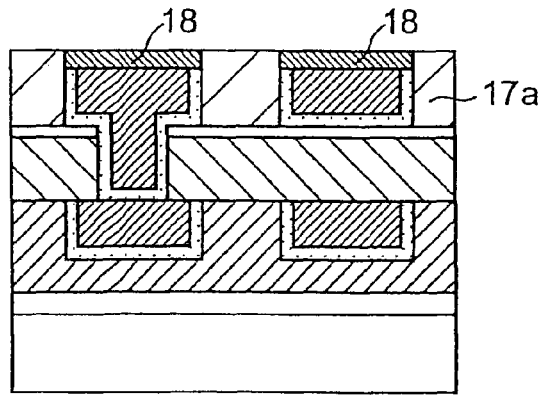

The eighth embodiment shown in FIGS. 8(a), 8(b) and 8(c), and 8(d), 8(e) and 8(f) correspond to the fourth embodiment shown in FIGS. 4(a), 4(b) and 4(c), and 4(d), 4(e) and 4(f). The eighth embodiment forms the cap layer 18 as an etching mask by lithography and etching as shown in FIG. 8(b) after the processes corresponding to those shown in FIGS. 4(a) and 4(b). The function of the cap layer 18 and the following processes are evident from the disclosure in the sixth embodiment.

Figure 9:
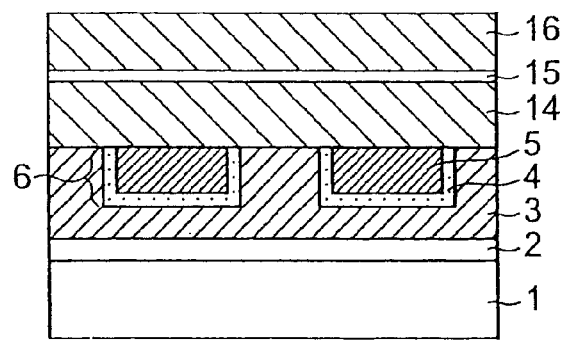
FIGS. 9(a), 9(b) and 9(c) are sectional views each illustrating an anterior process of a method of producing a semiconductor device having a plurality of wiring layers in a ninth embodiment according to the present invention.
FIGS. 9(d), 9(e) and 9(f) are sectional views illustrating posterior processes following the process shown in FIG. 9(c) for the method of producing the semiconductor device having the wiring layers in the ninth embodiment according to the present invention.
Figure 9:
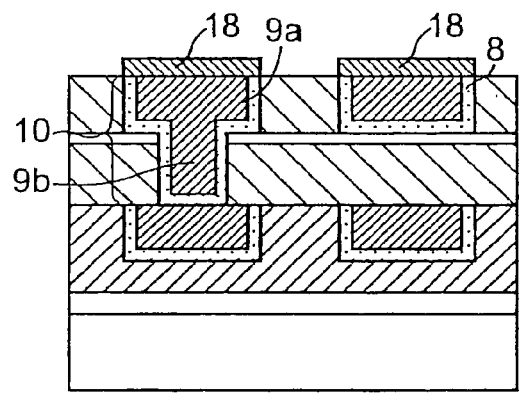
Figure 9:
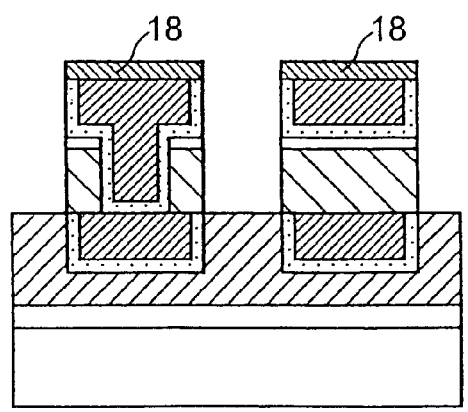
Figure 9:
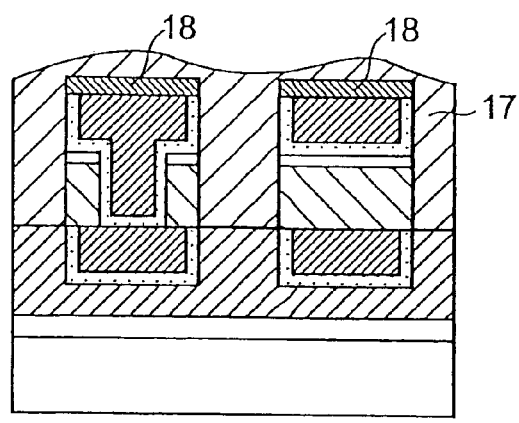
Figure 9:
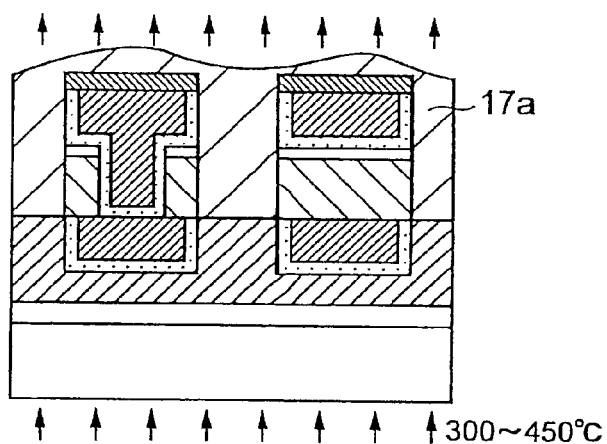
Figure 9:
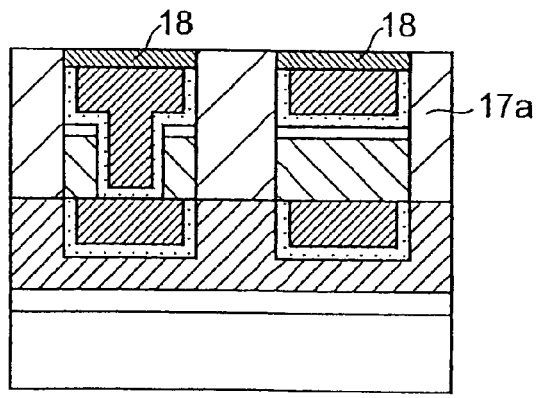

The ninth embodiment shown in FIGS. 9(a), 9(b) and 9(c), and 9(d), 9(e) and 9(f) correspond to the fifth embodiment shown in FIGS. 5(a), 5(b) and 5(c), and 5(d), 5(e) and 5(f). The ninth embodiment forms the cap layer 18 as an etching mask by lithography and etching as shown in FIG. 9(b) after the processes corresponding to those shown in FIGS. 5(a) and 5(b). The function of the cap layer 18 and the following processes are evident from the disclosure in the sixth embodiment.

The first to ninth embodiments for the methods of producing semiconductor device focus on the processes for the second wiring-layer structure. Not only that, however, the first to ninth embodiments can be applied to the first wiring-layer structure and also the third wiring-layer structure or more, for achieving multi-layered wiring structure having low-dielectric-constant insulating films by laminating wiring layers each made according to the present invention.

Tenth to Eighteenth Embodiments

Shown in FIGS. 10 to 18 are several representatives of semiconductor devices according to the tenth to eighteenth embodiments. These semiconductor devices can be produced by a person skilled in the art by applying the methods of the first to ninth embodiments to layer lamination.

These embodiments show a three-layer wiring structure as a modification of multi-layered wiring structure to the two-layer structure in the first to ninth embodiments. The tenth embodiment corresponds to the first embodiment. The eleventh to eighteenth embodiments correspond to the second to ninth embodiments, respectively.

Figure 10:
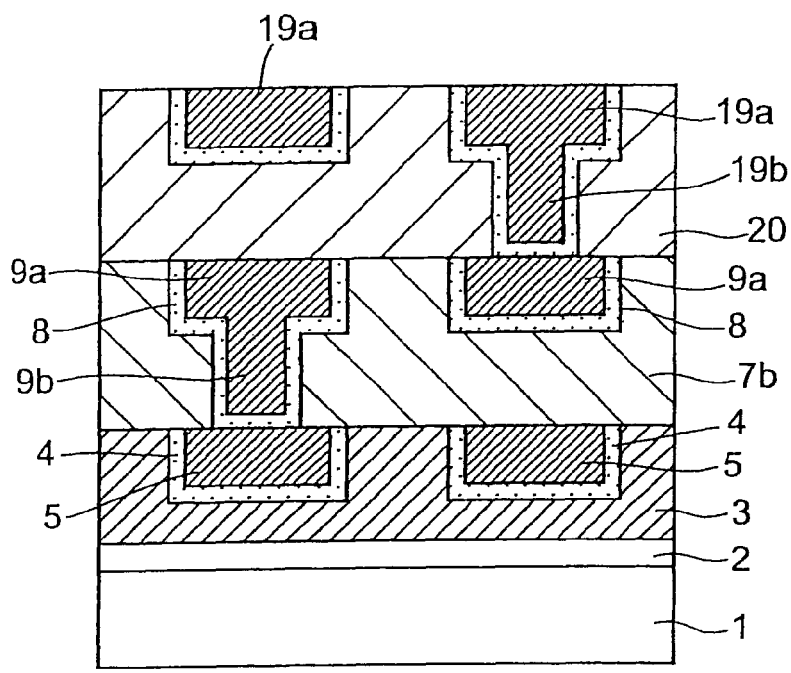
FIG. 10 is a sectional view showing a semiconductor device having a plurality of wiring layers in a tenth embodiment according to the present invention.
Figure 11:
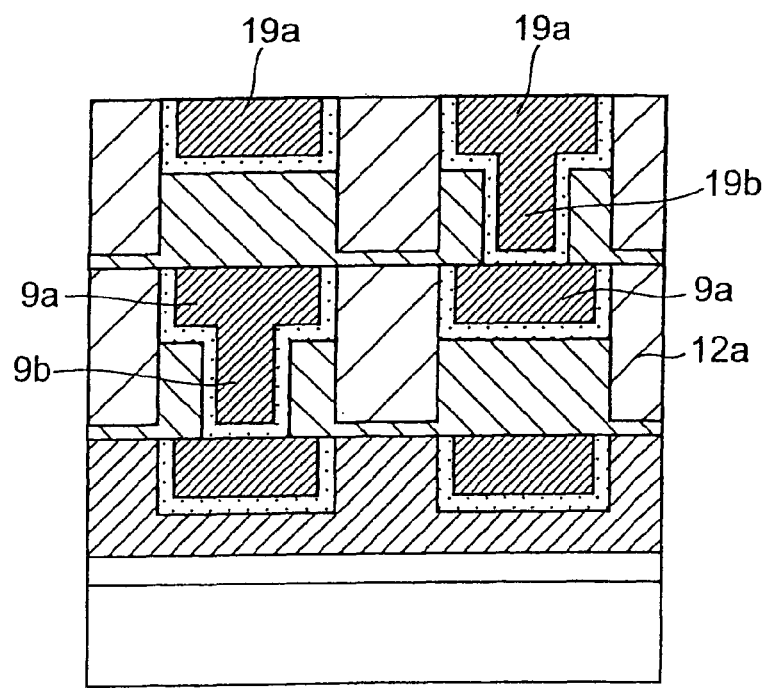
FIG. 11 is a sectional view showing a semiconductor device having a plurality of wiring layers in an eleventh embodiment according to the present invention.
Figure 12:
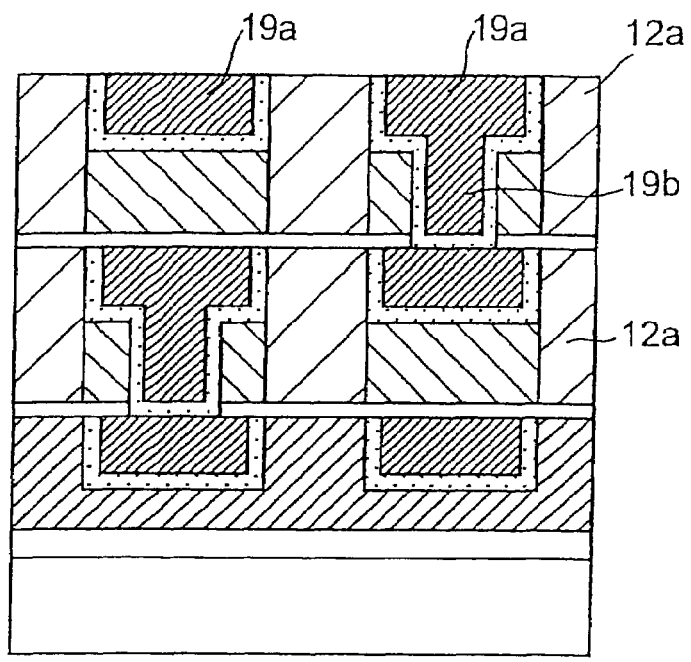
FIG. 12 is a sectional view showing a semiconductor device having a plurality of wiring layers in a twelfth embodiment according to the present invention.
Figure 13:
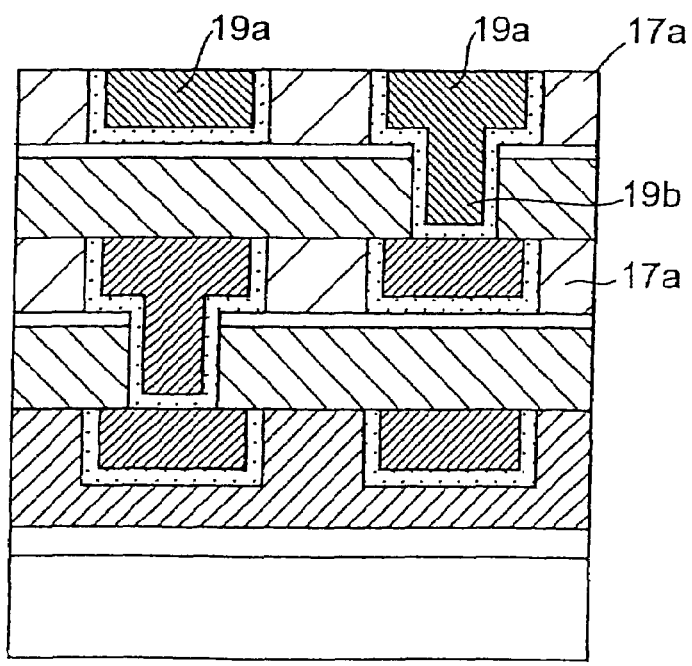
FIG. 13 is a sectional view showing a semiconductor device having a plurality of wiring layers in a thirteenth embodiment according to the present invention.
Figure 14:
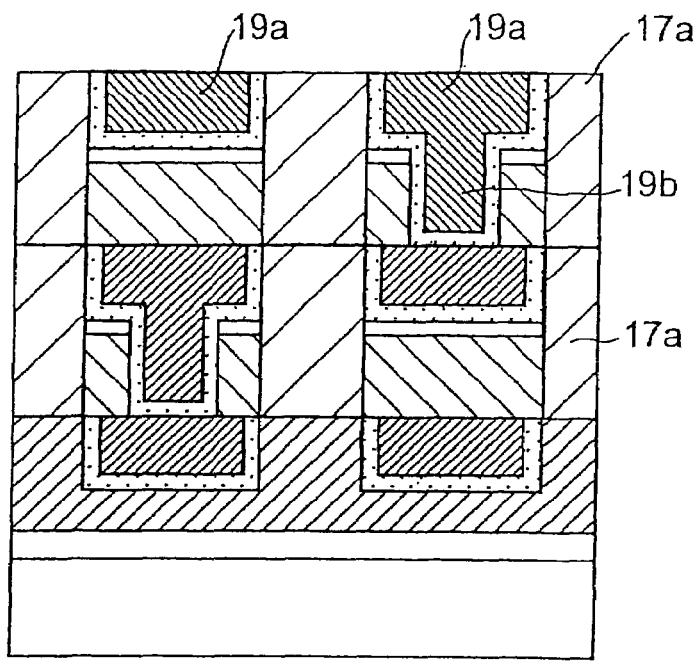
FIG. 14 is a sectional view showing a semiconductor device having a plurality of wiring layers in a fourteenth embodiment according to the present invention.
Figure 15:
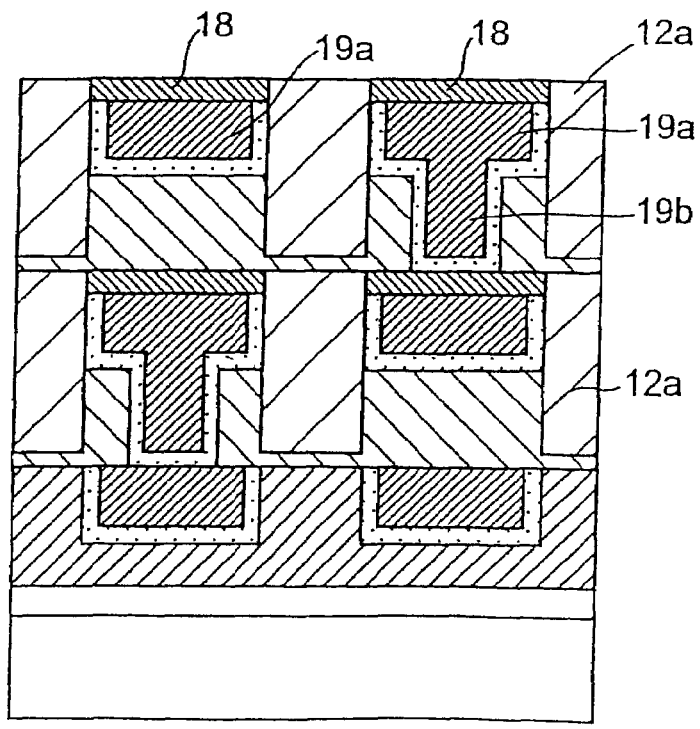
FIG. 15 is a sectional view showing a semiconductor device having a plurality of wiring layers in a fifteenth embodiment according to the present invention.
Figure 16:
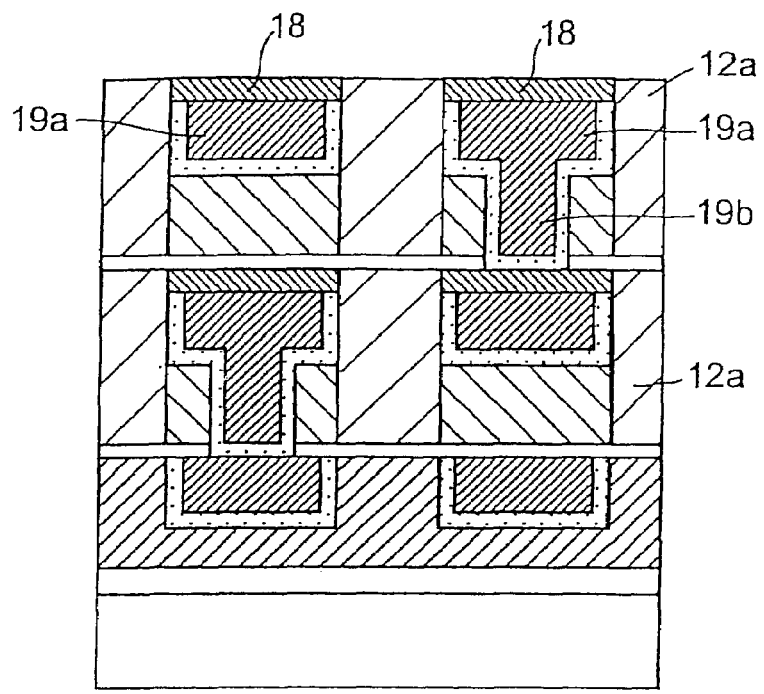
FIG. 16 is a sectional view showing a semiconductor device having a plurality of wiring layers in a sixteenth embodiment according to the present invention.
Figure 17:
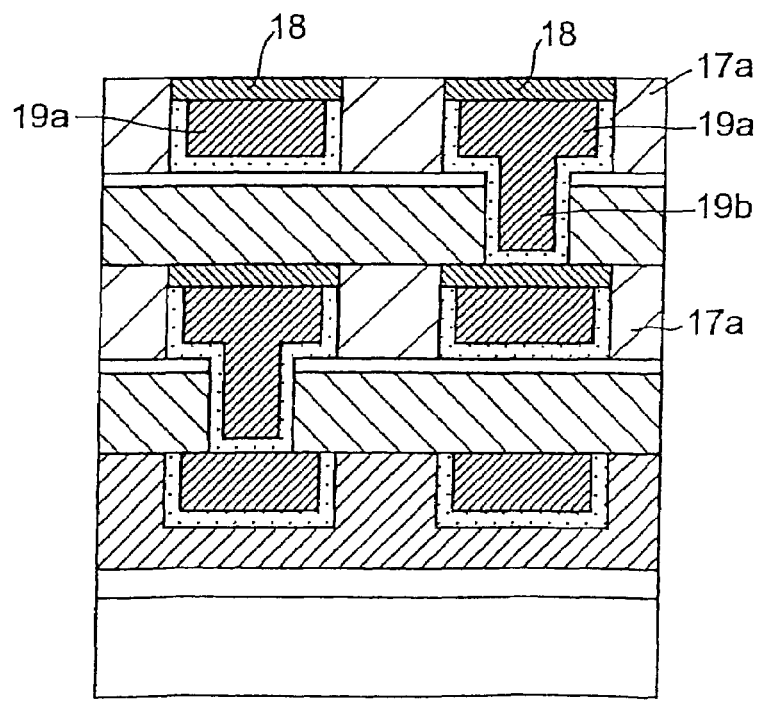
FIG. 17 is a sectional view showing a semiconductor device having a plurality of wiring layers in a seventeenth embodiment according to the present invention.
Figure 18:
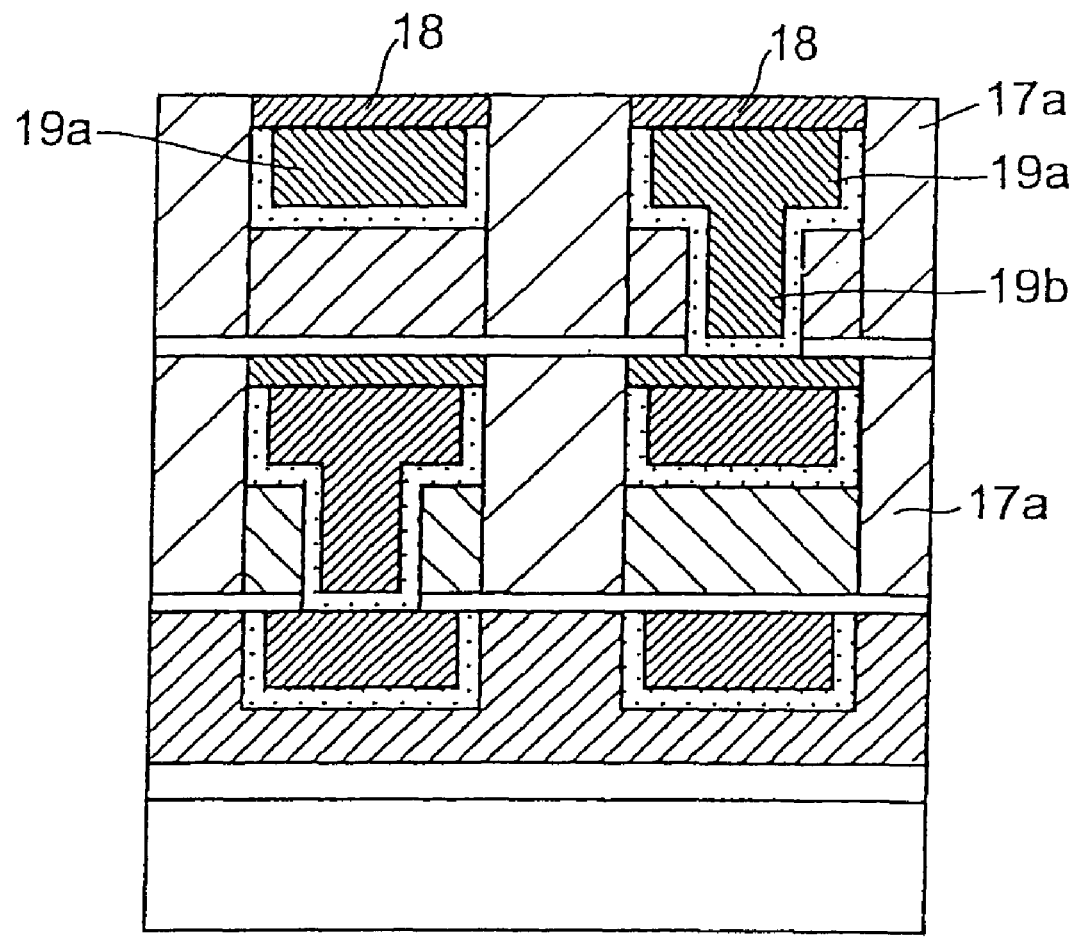
FIG. 18 is a sectional view showing a semiconductor device having a plurality of wiring layers in an eighteenth embodiment according to the present invention.

In detail, there is the basic construction according to the tenth through eighteenth embodiments, as shown in FIG. 10, in which the semiconductor device comprises a first insulating film 3 which is firstly formed in layer; a plurality of first wirings 5 formed on the first insulating film 3; a second insulating film 7b which is formed on the first wirings 5 and first insulating film 3; a plurality of second wirings 9a formed on the second insulating film 7b; a first plug 9b connecting several wirings of the first and second wirings 5 and 9a, formed in the second insulating film 7b; a third insulating film 20 which is formed on the second wirings 9a and second insulating film 7b; a plurality of third wirings 19a formed on the third insulating film 20; and a second plug 19b connecting several wirings of the second and third wirings 9a and 19a, formed in the third insulating film 20.

Moreover, although not shown, the present invention is applied to an n-th-layer wiring structure (n being an integer of four or more) as a further modification to the two-layer structure.

In detail, a semiconductor device having n-th-layer wiring structure may have the following elements: a first insulating film firstly formed in layer; a first wiring layer having a plurality of wirings, formed on the first insulating film; a second wiring layer having a plurality of wirings, formed on or over the first wiring layer; a second insulating film provided on the first insulating film formed as having a plane surface and the first wiring layer, and formed between adjacent wirings of the second wiring layer, located under the second wiring layer but on the first insulating film and the first wiring layer, at least a part of the second insulating film existing between the first and second wiring layers having a relative dielectric constant lower than a relative dielectric constant of the first insulating film; an (n−1)-th wiring layer having a plurality of wirings, formed on or over the second wiring layer; an (n−1)-th insulating film provided on or over the second insulating film formed as having a plane surface and the second wiring layer, and formed between adjacent wirings of the (n−1)-th wiring layer, located under the (n−1)-th wiring layer but over the second insulating film and the second wiring layer, at least a part of the (n−1)-th insulating film existing between the second and (n−1)-th wiring layers having a relative dielectric constant lower than a relative dielectric constant of the second insulating film; an n-th wiring layer having a plurality of wirings, formed on or over the (n−1)-th wiring layer; a low-dielectric-constant insulating film provided on the (n−1)-th insulating film formed as having a plane surface and the (n−1)-th wiring layer, and formed between adjacent wirings of the n-th wiring layer, located under the n-th wiring layer but on the (n−1)-th insulating film and the (n−1)-th wiring layer, at least a part of the low-dielectric-constant insulating film existing between the (n−1)-th and n-th wiring layers having a relative dielectric constant lower than a relative dielectric constant of the (n−1)-th insulating film.

The first to eighteenth embodiments employ Cu as a wiring metal material. In the present invention, however, Al, Au, Ag and W, etc., can be used as a wiring metal material instead of Cu.

It is further understood by those skilled in the art that the foregoing descriptions are embodiments of the disclosed devices and methods for producing the devices and the various changes and modifications may be made in the invention without departing from the sprit and the scope of the invention as hereinafter claimed.

As disclosed in detail, the invention of the semiconductor device and the method of producing the semiconductor device offers several types of multi-layered wiring structures with no processes such as RIE to interlayer-insulating films made of an insulating film of a low dielectric constant, such as an organic material-applied insulating film and a porous insulating film, thus achieving excellent devices properties with low dielectric constant.

What is claimed is:

1. A method of producing a semiconductor device including a plurality of wiring layers, comprising:
   forming a first interlayer-insulating film;
   forming a plurality of first grooves for wiring in the first interlayer-insulating film;
   forming a first wiring layer by filling metallic films in the first grooves for wiring;
   polishing and removing upper surfaces of the first wiring layer and the first interlayer-insulating film to flatten the upper surfaces thereof;
   forming a second interlayer-insulating film on flattened upper surfaces of the first wiring layer and the first interlayer-insulating film;
   forming a barrier insulating film on the second interlayer-insulating film;
   forming a third interlayer-insulating film on the barrier insulating film;
   etching the second interlayer-insulating film, the barrier insulating film, and the third interlayer-insulating film and removing a portion of the second interlayer-insulating film, the barrier insulating film, and the third interlayer-insulating film to provide a first contact hole and a second groove for wiring;
   forming a second wiring layer including a wiring and plug by filling metallic films in the first contact hole and the second groove for wiring;

removing the third interlayer-insulating film to expose the barrier insulating film and the second interlayer-insulating film;

depositing a fourth interlayer-insulating film on the barrier insulating film and the second interlayer-insulating film being exposed;

performing a thermal process to the fourth interlayer-insulating film at a predetermined temperature to promote dehydrating polymerization and solvent evaporation to generate pores in the fourth interlayer-insulating film so as to form a porous insulating film; and polishing and removing an upper surface of the fourth interlayer-insulating film to flatten the upper surface thereof.

2. The method of producing a semiconductor device according to claim 1, wherein the dehydrating polymerization is achieved by annealing at a temperature in a range from 300 to 450° C., or as low as possible for the thermal process.

3. The method of producing a semiconductor device according to claim 1, wherein the dehydrating polymerization is achieved by annealing in an NH3-gas ambient or with electron-beam irradiation.

4. The method of producing a semiconductor device according to claim 1, further comprising, after forming the second wiring layer including the wiring and plug by filling the metallic films in the first contact hole and the second groove for wiring:

polishing and removing upper surfaces of the second wiring layer and the second interlayer-insulating film to flatten the upper surfaces thereof; and forming a cap layer as a mask for etching in a next process on a top of the second wiring layer.

5. The method of producing a semiconductor device according to claim 1, wherein the predetermined temperature for the solvent evaporation is 400° C.

6. The method of producing a semiconductor device according to claim 1, wherein the second interlayer-insulating film is made of at least one insulating film in the second groove for wiring, the insulating film being made of a material selected from a group consisting of: resin having siloxane bonding as a major structure, resin having C—C bonding as a major structure, or a resin having C=C bonding as a major structure.

* * * * *